United States Patent
Glover et al.

(10) Patent No.: US 6,291,996 B1
(45) Date of Patent: Sep. 18, 2001

(54) APPARATUS FOR AND METHOD OF DETERMINING VALUES OF RELAXATION PARAMETERS

(75) Inventors: Paul Martin Glover, Guildford; Richard John Hill, Aldershot, both of (GB)

(73) Assignee: BTG International Limited, London (GB)

(*) Notice: Subject to any disclaimer, the term of this patent is extended or adjusted under 35 U.S.C. 154(b) by 0 days.

(21) Appl. No.: 09/476,095

(22) Filed: Jan. 3, 2000

Related U.S. Application Data

(63) Continuation of application No. PCT/GB98/02419, filed on Aug. 11, 1998.

(30) Foreign Application Priority Data

Aug. 13, 1997 (GB) .................................. 9717183
Sep. 17, 1997 (GB) .................................. 9719806

(51) Int. Cl.[7] ...................................................... G01V 3/00
(52) U.S. Cl. ............................ 324/309; 324/307; 324/322
(58) Field of Search .................................. 324/309, 300, 324/307, 312, 318, 322

(56) References Cited

U.S. PATENT DOCUMENTS 4,734,646   3/1988   Shenoy et al. ..................... 324/309

OTHER PUBLICATIONS

Liu et al., "Calculation of T/sub 1/, T/sub 2/, and proton spin density images in nuclear magnetic resonance imaging" Journal of Magnetic Resonance, Oct. 15, 1989, USA, vol. 85, No. 1, pp. 95–110, XP000087259.

Conturo T E et al.: "Improved determination of spin density, T/sub 1/ and T/sub 2/ from a three-parameter fit to multiple-delay-multiple-echo (MDME) NMR images", Physics in Medicine and Biology, Dec. 1986, UK vol. 31, No. 12, pp. 1361–1380, XP002071923, Chapter 3, Techniques.

Graumann R et al.: "A new pulse sequence for determining T/sub 1/ and T/sub 2/ simultaneously" Medical Physics, Sep.–Oct. 1986, USA, vol. 13, No. 5, pp. 644–647, XP002071924.

(List continued on next page.)

Primary Examiner—Christine Oda
Assistant Examiner—Brij B. Shrivastav
(74) Attorney, Agent, or Firm—Nixon & Vanderhye

(57) ABSTRACT

In an apparatus for determining relaxation parameters $T_1$ and $T_2$, a sample 10 is placed in a constant magnetic field supplied by magnet 12. An rf transmitter/receiver probe 14 is used to apply excitation pulses to the sample 10 and to detect a resonance response signal. The probe 14 is driven by a pulse programmer 16 via a modulator 18, a mixer 20 and a linear power amplifier 22. The resonance response signal is fed to an acquisition computer 24 via a preamplifier 26, a rf amplifier 28, a mixer 30 and phase sensitive detectors 32, 34. An oscillator 36 having a reference frequency synchronises the excitation pulses and the detected signal by means of the mixer 20 and the mixer 30 respectively. Gradient coils 38 provide the gradients necessary for acquiring the resonance response signal, and are driven by the pulse programmer 16 via gradient coil amplifiers 40, 42, 44 using data stored in the waveform memory 46. The acquisition computer 24 processes the acquired resonance response signal to determine values of $T_1$, $T_2$, $\theta$ and $\rho$. Images may be produced based on any of these parameters or combinations thereof. A corresponding method is also described.

43 Claims, 8 Drawing Sheets

OTHER PUBLICATIONS

O'Donnell M et al.: "Toward an automated analysis system for nuclear magnetic resonance imaging. I. Efficient pulse sequences for simultaneous T/sub 1/–T/sub 2/imaging" Medical Physics, Mar.–Apr. 1986, USA, vol. 13, No. 2, pp. 182–190, XP002071925, Chapter III, T1 and combined T1–T2 pulse sequences.

Schad L R et al.: "Two–exponential analysis of spin–spin proton relaxation times in MR imaging using surface coils", Magnetic Resonance Imaging, Jul.–Aug. 1989, UK, vol. 7, No. 4, pp. 357–362, XP002071926.

Ordidge R J et al.: "High–Speed Multislice $T_1$ Mapping Using Inversion–Recovery Echo–Planar Imaging", Magnetic Resonance in Medicine 16, pp. 238–245 (1990).

Mansfield P et al., "Measurement of $T_1$ by echo–planar imaging and the construction of computer–generated images", Phys. Med. Biol., 1986, vol. 31, No. 2, pp. 113–124.

Poon C S et al., Practical T2 Quantitation for Clinical Applications[1], Original Research, vol. 2, No. 5, JMRI, pp. 541–553.

Kay I et al., "Practical Implementation and Optimization of One–Shot $T_1$ Imaging", Magnetic Resonance in Medicine 22, pp. 414–424 (1991).

Howsemann A M et al., "Improvements in snap–shot nuclear magnetic resonance imaging", The British Journal of Radiology 61, pp. 822–828 (1988).

Epstein F H et al., "Spoiling of Transverse Magnetization in Gradient–Echo (GRE) Imaging during the Approach to Steady State", MRM 35, pp. 237–245 (1996).

Franconi et al., "T1 mapping from spin echo and stimulated echoes", Med. Phys. 22(11), Pt. 1, Nov. 1995.

Stollberger R et al., Imaging of the Active $B_1$ Field in Vivo, MRM 35, pp. 246–251 (1996).

Miyati T et al., "Dual Dynamic Contrast–Enhanced MR Imaging", JMRI 7, pp. 230–235 (1997).

Marquardt D W, "An Algorithm for Least–Squares Estimation of Nonlinear Parameters", J. Soc. Indust. Appl. Math. vol. 11, No. 2, Jun. 1963.

Bain A D et al., "Hahn Spin Echoes in Large Static Gradients Following a Series of 90° Pulses", Journal of Magnetic Resonance, Series A 123, pp. 49–55 (1996).

APPARATUS FOR AND METHOD OF DETERMINING VALUES OF RELAXATION PARAMETERS

This is a continuation of PCT application PCT/GB98/02419, filed Aug. 11, 1998, the entire content of which is hereby incorporated by reference in this application.

The present invention relates to an apparatus for and a method of determining values of relaxation parameters, $T_1$ and $T_2$, for use with a resonance technique in which a resonance response signal is produced in response to excitation.

The invention is suitable for use with Nuclear Magnetic Resonance (NMR) techniques, and in particular, although not exclusively, with Magnetic Resonance Imaging (MRI) techniques, but may also be used in Nuclear Quadrupole Resonance, Electron Spin Resonance, and other such techniques.

The present invention claims priority from UK Patent Application No. 9717183.9, filed Aug. 13, 1997, whose disclosure is incorporated herein by reference.

NMR is a technique in which a radio frequency (rf) excitation pulse is applied to a sample in the presence of a magnetic field, and echo or other signals resulting from the excitation of protons (that is hydrogen atoms) in the sample are subsequently detected. In MRI, the magnitudes of the echo signals are used to construct an image. The concentration of hydrogen atoms will generally correspond to the water density in the sample. MRI is therefore widely used for imaging tissue in the human body.

The echo signals will have various parameters associated with them, such as the spin-lattice relaxation time, $T_1$ and the spin-spin relaxation time, $T_2$. These parameters are properties that are inherent to the material being sampled. The relaxation parameters $T_1$ and $T_2$ are often used to provide contrast in images, because the typical variation in these parameters may be much larger than that in straightforward proton density. For example, the difference in the proton concentration between normal and abnormal tissue in the human body may only be a few percent, while the difference between the relaxation parameters may be much higher. Grey and white areas in the brain may also have very different $T_1$ and $T_2$ values.

A technique for the measurement of $T_1$ for imaging was proposed by Mansfield et al in Physical Medical Biology, vol 31, no. 2, pp 113–124. Mansfield et al proposed performing two EPI experiments using different delay times, and analyzing the data resulting from the two experiments to obtain values of $T_1$. An alternative $T_1$ imaging technique was investigated by Kay et al in Magnetic Resonance in Medicine vol. 22, pp 414–424. Kay et al used a Look-Locker excitation pulse sequence to acquire a set of proton density images, and used a fitting procedure to derive values of $T_1$ in order to obtain a $T_1$ map.

A technique for $T_2$ imaging was proposed by Poon et al in Journal of Magnetic Resonance Imaging, vol 4, pp 701–708. Poon et al proposed an excitation pulse sequence which was tailored specifically for $T_2$ imaging. Thirty two echoes were acquired and values of $T_2$ calculated from them.

The prior art techniques for determining values of $T_1$ use different types of excitation pulse sequence to those for determining values of $T_2$. Hence, the prior art techniques suffer from the problem that it would be very inefficient to determine both $T_1$ and $T_2$, since two different experiments would have to be set up and run separately. This would be time consuming and would make inefficient use of expensive resources.

In one aspect of the present invention, the problems in the prior art are sought to be overcome by providing an apparatus for determining values of relaxation parameters, $T_1$ and $T_2$, for use with a resonance technique in which a resonance response signal is produced in response to excitation of a sample, the apparatus comprising means for determining values of both $T_1$ and $T_2$ of the sample from said response signal.

Hence, the values of the relaxation parameters $T_1$ and $T_2$ are measured simultaneously. Therefore only one experiment need be done to obtain values of both $T_1$ and $T_2$, resulting in improved efficiency.

As used herein, the term "resonance response signal" may connote a single such signal or a plurality of individual such signals generated, for example, by a plurality of excitation pulses.

If, for example, a series of excitation pulses is applied to a sample, under certain conditions the resultant resonance response signal will exhibit a transient behaviour which will be oscillatory in nature. It has been discovered pursuant to the present invention that this transient behaviour contains information from which the values of $T_1$ and $T_2$ may be derived. Therefore, in a preferred embodiment of the invention, the means for determining values of $T_1$ and $T_2$ may comprise means for determining the values of $T_1$ and $T_2$ from the transient behaviour of the response signal. This can provide an efficient technique for determining the values of $T_1$ and $T_2$.

The means for determining the values of $T_1$ and $T_2$ may be arranged to determine their values by fitting an equation to the transient behaviour of the response signal, to enable efficient determination of their values.

For example, the determining means may comprise means for fitting the Bloch equation to the transient behaviour of the response signal. This may yield accurate quantitative values directly with no need for further calibration of the apparatus.

Alternatively, the determining means may comprise means for fitting a (typically empirical) equation to the transient behaviour of the response signal to thereby obtain a set of fit parameters, and means for mapping the set of fit parameters to values of $T_1$ and $T_2$ using predetermined calibration values. This technique may require less processing and therefore be faster.

The means for determining the values of $T_1$ and $T_2$ may be adapted to also determine values of the flip angle, $\theta$. This can provide useful additional information.

Another aspect of the invention provides an apparatus for resonance testing the sample, comprising:
  means for applying the excitation;
  means for detecting the response signal; and
  the means as aforesaid for determining the values of $T_1$ and $T_2$.

The means for detecting the response signal may further comprise means for acquiring a set of image data, and may in particular comprise means for acquiring image data after each of at least two (and preferably all) of the excitation pulses to thereby obtain a set of image data; indeed a number of sets of image data may be obtained. The means for acquiring image data may be adapted to acquire such data using a single or multiple scan technique, such as Echo Planar Imaging, Echo Volumar Imaging, a Spiral Scan method or a 2-Dimensional Fourier Transformation technique.

The means for determining the values of $T_1$ and $T_2$ may be arranged to perform a pixel-by-pixel fitting procedure through the set of image data. Alternatively, the means for determining the values of $T_1$ and $T_2$ may comprise means for determining average values of groups of pixels and means for performing a fitting procedure to the average values through the set of image data.

The means for applying the excitation may comprise means for applying a sequence of excitation pulses, and, if so, the apparatus may further comprise means for applying a gradient magnetic field after each pulse, the field being the same for at least two of said pulses. In the preferred embodiment, the same gradient evolution (and hence imaging module) is used for preferably all of the pulses.

The apparatus may comprise means for calculating the optimum number of repetitions of the excitation pulses for the best measurement of $T_2$ and $T_1$, and the means for applying excitation may be adapted to apply this number of pulses.

The apparatus may further comprise means for determining an appropriate number of repetitions of the excitation pulses for the determination of $T_2$ and $T_1$, and wherein the excitation applying means is adapted to apply said appropriate number of excitation pulses.

Again, the apparatus may further comprise means for determining an appropriate time interval between the excitation pulses for the determination of $T_2$ and $T_1$, and the means for applying excitation may be adapted to apply pulses with said appropriate time interval.

The means for applying excitation may be arranged to apply between 5 and 40, and preferably between 10 and 25, excitation pulses. These ranges have been found to be optimal. Likewise, the means for applying excitation may be arranged to apply pulses with a repetition time of between 1 ms and 500 ms, and preferably between 10 ms and 300 ms, and more preferably between 50 ms and 150 ms.

The apparatus may further comprise means for generating an image in dependence upon the values of $T_1$ and/or $T_2$, and may further comprise means for generating an image in dependence upon the value of $\theta$.

The apparatus may further comprise means for determining, from the values of $T_1$ and/or $T_2$, a weighting for a further parameter. The apparatus may in particular provide a $T_1$ and/or $T_2$ weighting for a proton density image.

In a related aspect of the present invention, there is provided a method of determining values of relaxation parameters, $T_1$ and $T_2$, for use with a resonance technique in which a resonance response signal is produced in response to excitation of a sample, the method comprising determining values of both $T_1$ and $T_2$ of the sample from the response signal.

The step of determining the values of $T_1$ and $T_2$ may comprise determining their values from the transient behaviour of the response signal.

The step of determining the values of $T_1$ and $T_2$ may comprise determining their values by fitting an equation to the transient behaviour of the response signal, and, if so, may further comprise fitting the Bloch equation to the transient behaviour of the response signal, or alternatively may comprise fitting an equation to the transient behaviour of the response signal to thereby obtain a set of fit parameters, and mapping the set of fit parameters to the values of $T_1$ and $T_2$ using predetermined calibration values.

The method may further comprise determining values of the flip angle, $\theta$.

The method may comprise a method for resonance testing the sample, and further comprise the steps of:
applying the excitation;
detecting the response signal; and
determining the values of $T_1$ and $T_2$.

The step of detecting the response signal may comprise acquiring a set of image data. The step of acquiring image data may comprise acquiring such data using a single or multiple scan technique, such as Echo Planar Imaging, Echo Volumar Imaging, a Spiral Scan method or a 2-Dimensional Fourier Transformation technique.

The step of determining the values of $T_1$ and $T_2$ may comprise performing a pixel-by-pixel fitting procedure through the set of image data.

Alternatively, the step of determining the values of $T_1$ and $T_2$ may comprise determining average values of groups of pixels, and performing a fitting procedure to the average values through the set of image data.

The step of applying excitation may comprise applying a sequence of excitation pulses. If so, the method may further comprise applying a gradient magnetic field after at least two of said pulses, the field being the same for each of at least two of said pulses. In addition, or alternatively, the method may comprise determining an appropriate number of repetitions of the excitation pulses for the determination of $T_2$ and $T_1$, and wherein the step of applying excitation comprises applying said appropriate number of excitation pulses. Likewise, the method may comprise determining an appropriate time interval between the excitation pulses for the determination of $T_2$ and $T_1$, and wherein the step of applying excitation comprises applying pulses with said appropriate time interval. The step of applying excitation pulses may comprise applying excitation pulses with a repetition time of less than $T_1$ and preferably less than half, and more preferably less than one quarter, $T_1$. In addition, or alternatively, the step of applying excitation pulses may comprise applying excitation pulses with a repetition time of less than $T_2$ and preferably less than half, and more preferably less than one quarter, $T_2$.

The step of applying excitation may comprise applying between 5 and 40, and preferably between 10 and 25, excitation pulses.

The step of applying excitation may comprise applying pulses with a repetition time of between 1 ms and 500 ms, and preferably between 10 ms and 300 ms, and more preferably between 50 ms and 150 ms.

The method may further comprise generating an image in dependence upon the values of $T_1$ and/or $T_2$.

The method may further comprise generating an image in dependence upon the value of $\theta$.

The method may further comprise determining, from the values of $T_1$ and/or $T_2$ and/or $\theta$ a weighting required for a further parameter.

The method may further comprise generating a $\theta$ map, smoothing the $\theta$ map, and using the smoothed $\theta$ map for determining values of $T_1$ and $T_2$.

In another related aspect of the present invention, a method for the simultaneous measurement of the NMR relaxation parameter, $T_1$ and $T_2$, is provided. Maps of $T_1$ and $T_2$ and proton density may be obtained. The method may comprise an Echo Planar Imaging technique or a 2D Fourier Transform technique. The method may comprise using the initial transient approach to steady state to give information. A numerical solution to the Bloch equation may be used to fit the transient response. Alternatively, an empirical equation fit to the transient response, followed by mapping onto the NMR parameters may be used. The method may comprise measuring and mapping the pulse angle (rf homogeneity). The method may comprise calculating the optimum number of repetitions and the optimum time interval for the best measurement of $T_1$ and $T_2$. The method may comprise arbitrarily generating an image of any required weighting. The method may comprise selecting the weighting required for further imaging.

Preferred features of the present invention will now be described, purely by way of example, with reference to the accompanying drawings, in which.

Figure 6A:
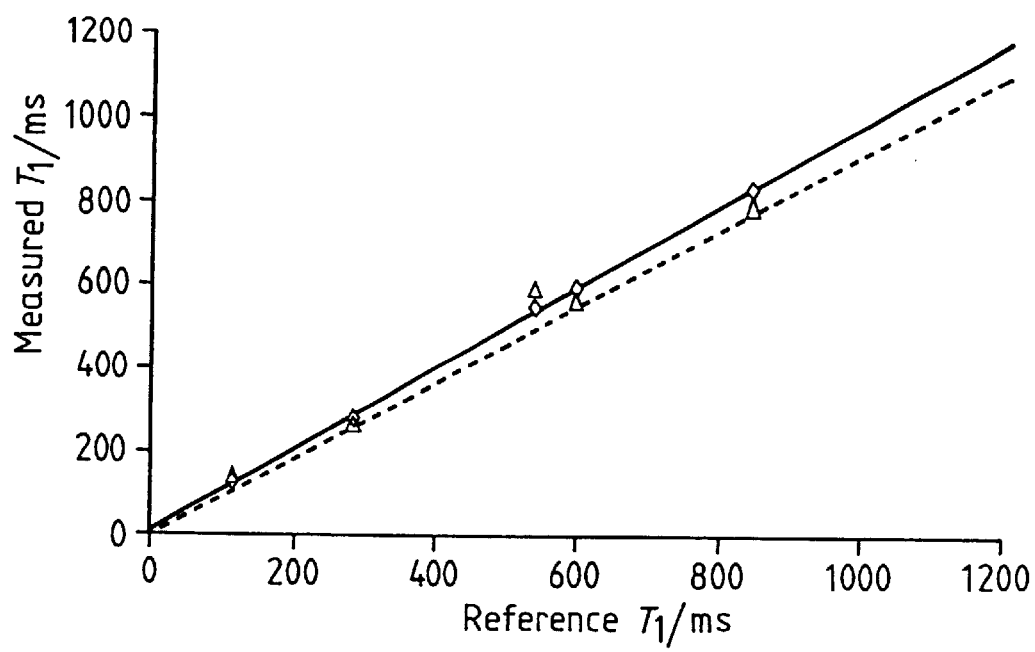
Figure 6B:
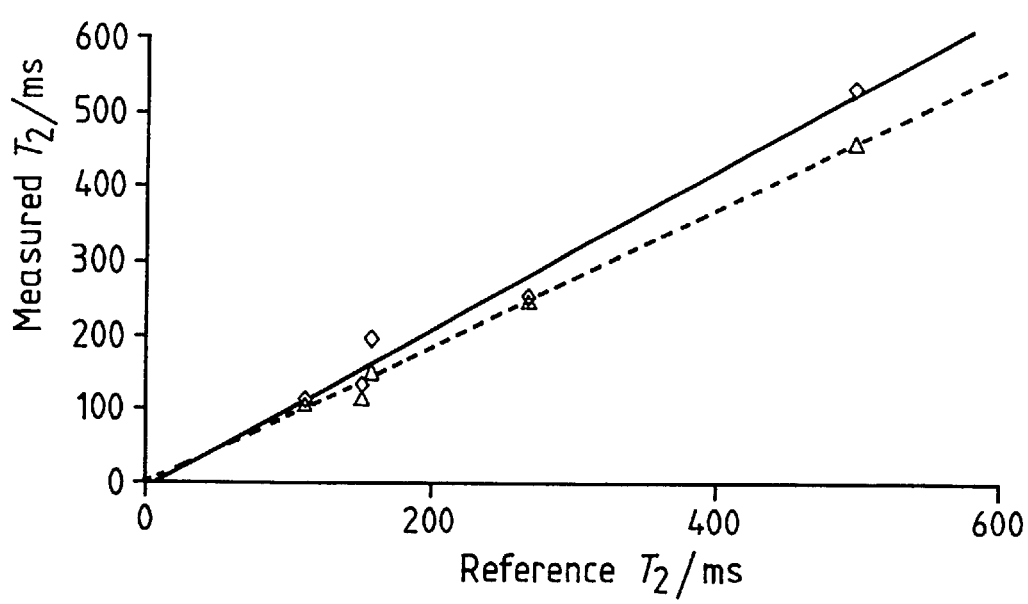
Figure 7A:
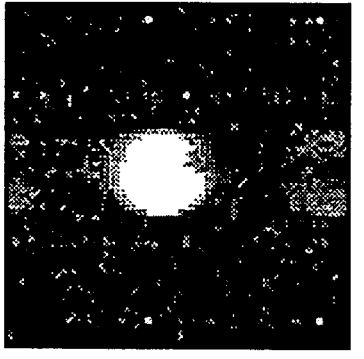
Figure 7B:
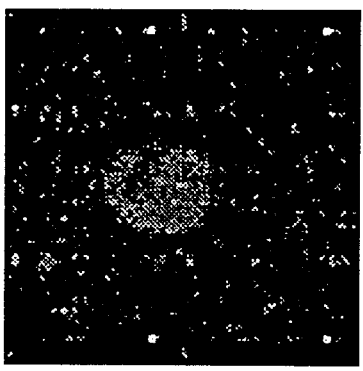
Figure 7C:
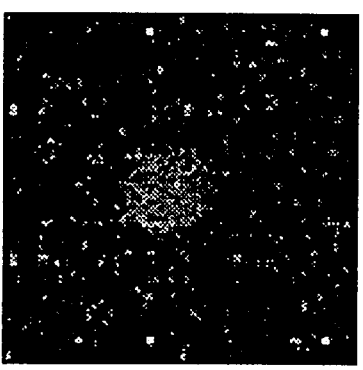
Figure 7D:
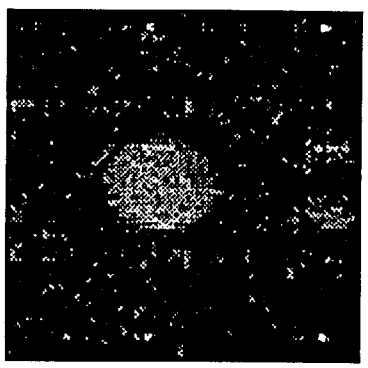
Figure 7E:
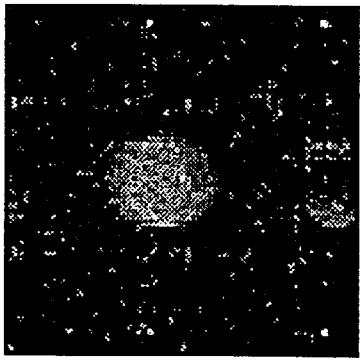
Figure 7F:
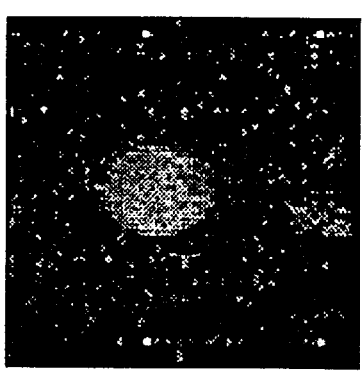
Figure 7G:
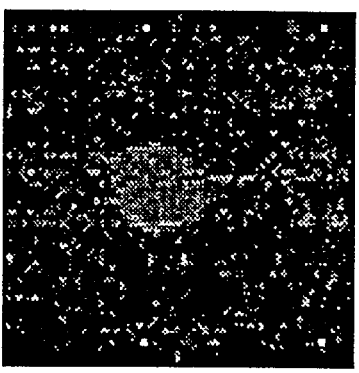
Figure 7H:
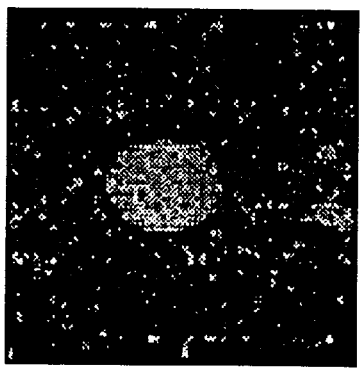
Figure 8:
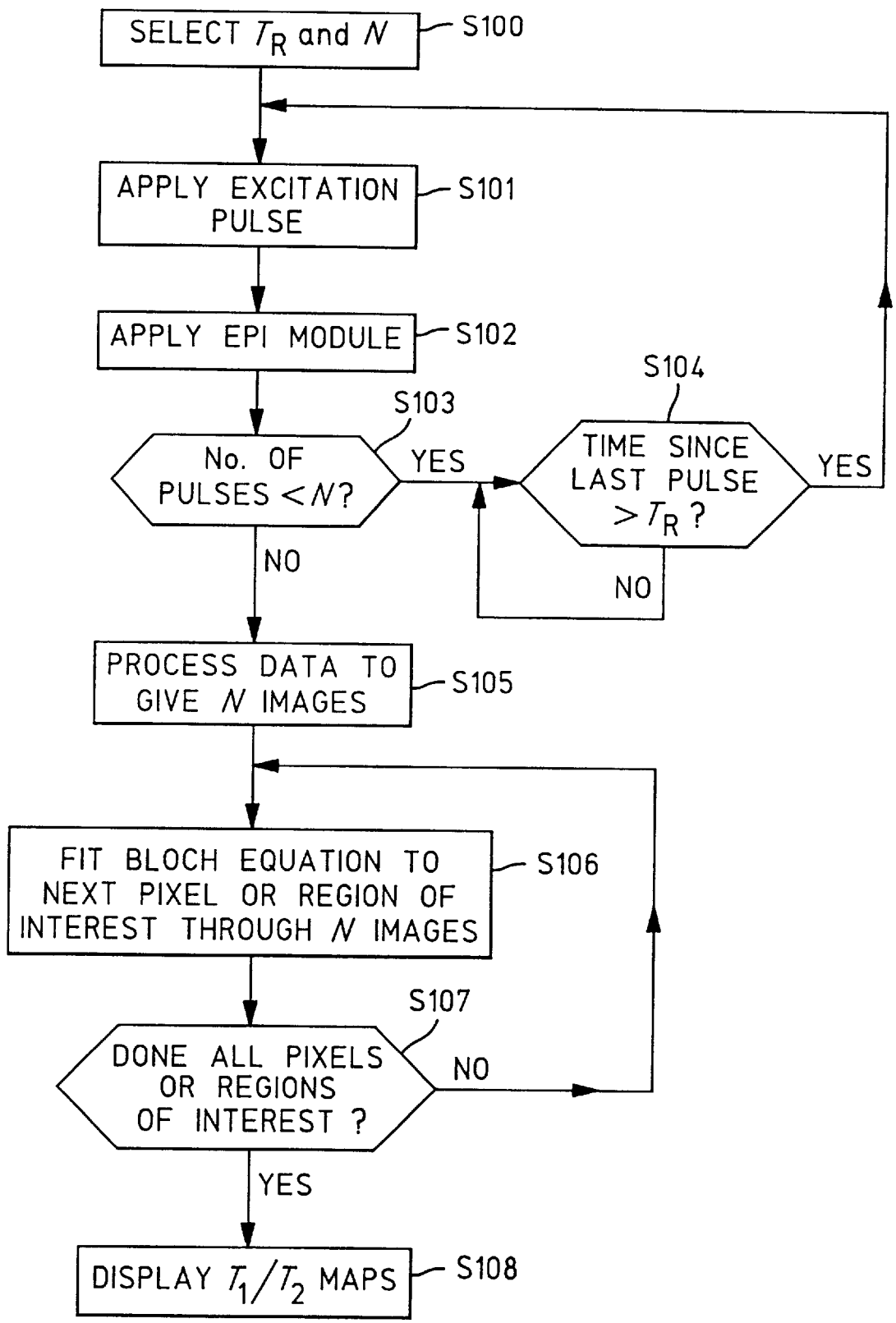
Figure 9:
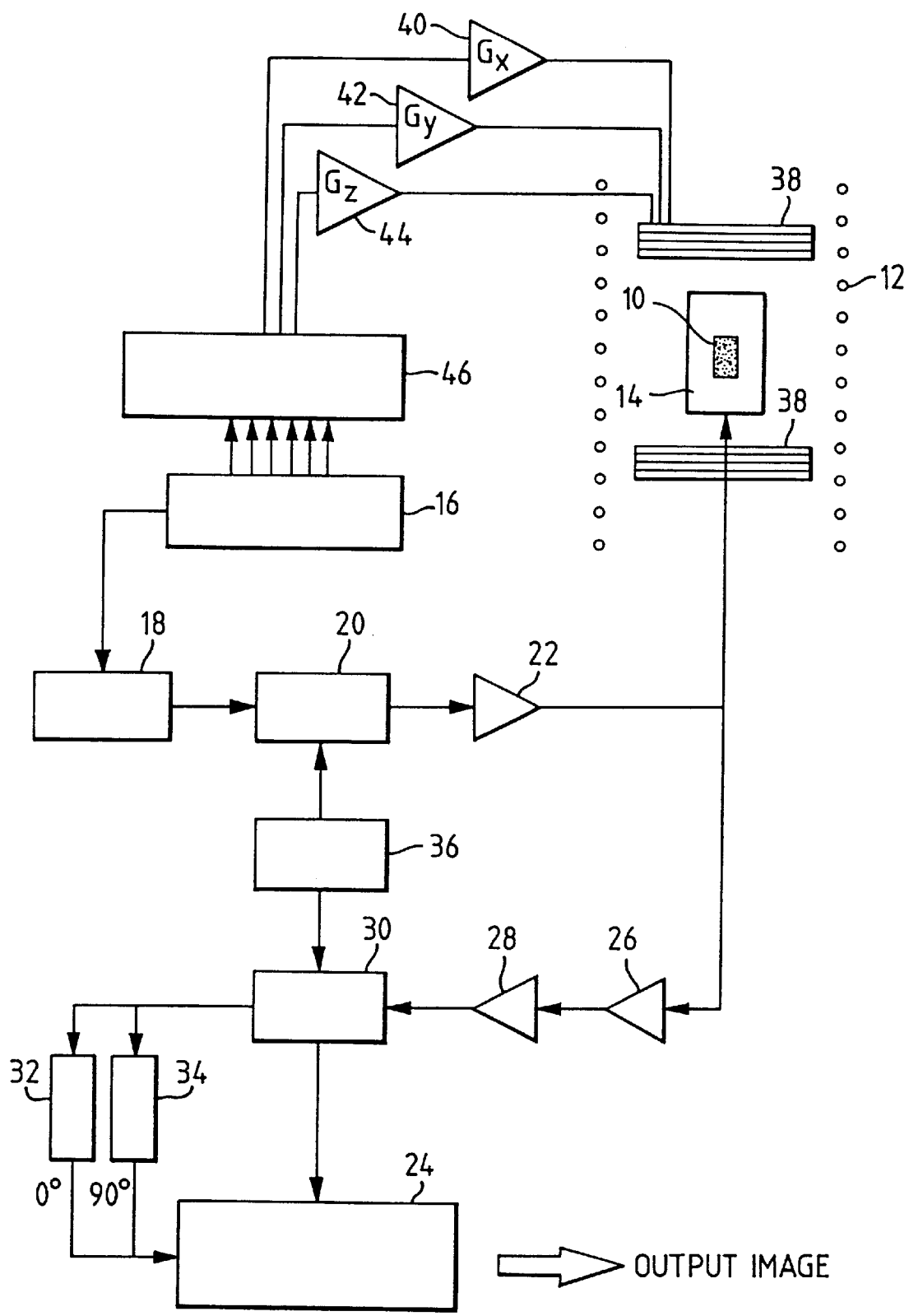

FIG. 6a gives a comparison of the saturation recovery (diamonds) and EPI (triangles) measurements of $T_1$ with the reference values for $T_R$=100 ms;

FIG. 6b shows a comparison of the saturation recovery and EPI measurements of $T_2$ with the reference values for $T_R$=100 ms;

FIG. 7 shows a series of EPI images of a $MnCl_2$ doped phantom;

FIG. 8 shows a flow diagram illustrating the method of a preferred embodiment of the invention; and FIG. 9 shows a preferred embodiment of the apparatus.

Figure 1:
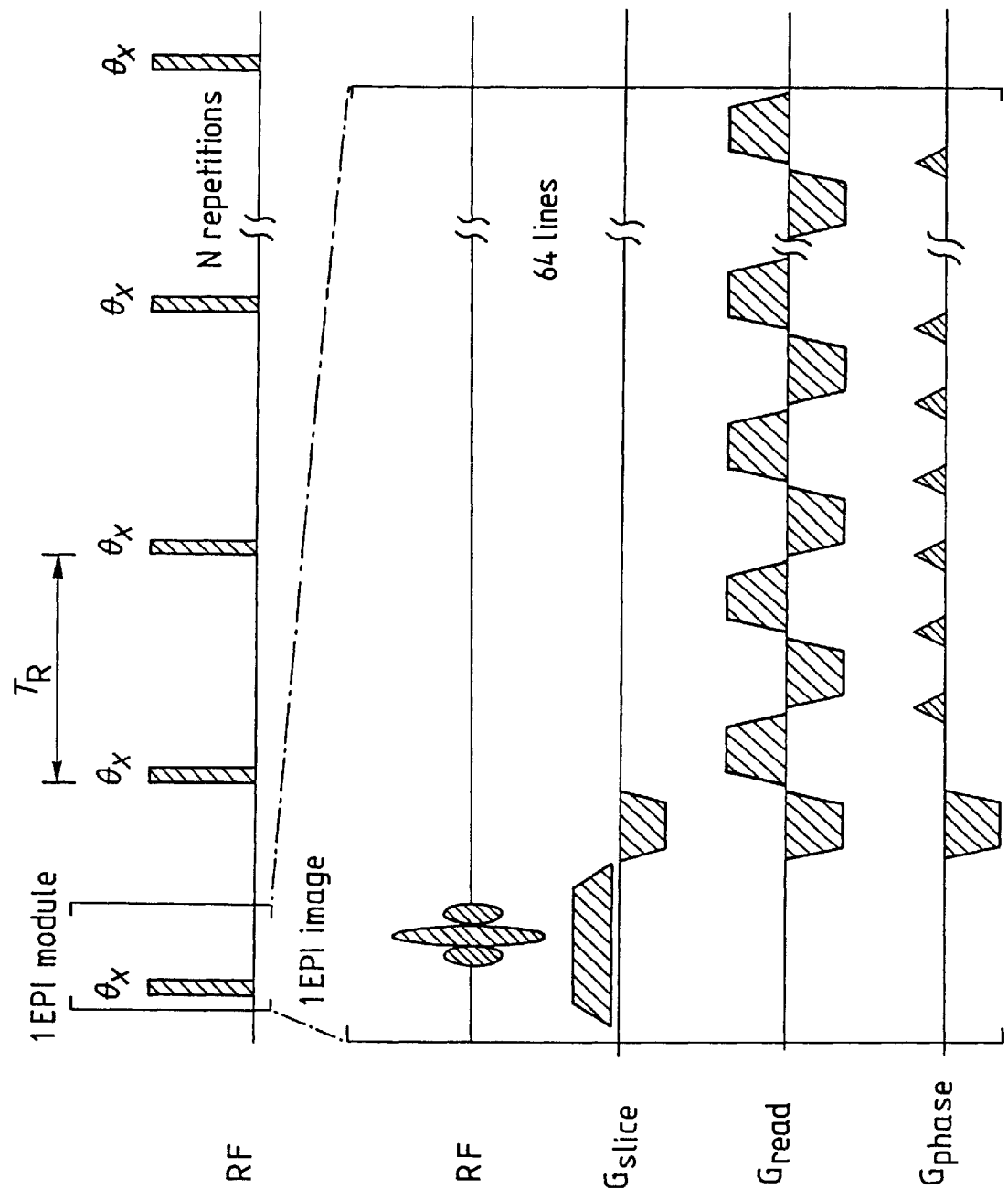
FIG. 1 shows a combined saturation recovery/MBEST EPI pulse sequence.

The theoretical background to the invention will first be explained, with reference to a preferred embodiment in which an Echo Planar Imaging sequence is used to acquire the data from which the values of $T_1$ and $T_2$ are determined. Echo Planar Imaging (EPI) is a particular type of MRI, in which an entire image is acquired by sampling the echo data resulting from a single rf excitation pulse. The sampling domain is commonly referred to as k-space. A typical EPI pulse sequence is shown in FIG. 1. The sequence comprises a sequence of 90° selective pulses (denoted $\theta_x$) each followed by a EPI readout module, comprising $G_{slice}$, $G_{read}$ and $G_{phase}$ magnetic field gradients. In this case, an MBEST (Modulus Blipped Echo-planar Single-pulse Technique) EPI sequence is repeated with a short repetition time and a flip-angle $\theta$ close to 90°, although the technique may be used with any variant of EPI. Each module preferably has the same characteristics. The whole of k-space is scanned in a few tens of milliseconds after each $\theta_x$ pulse, and the acquired data are Fourier transformed to obtain a set of proton density ($\rho$) images.

In normal imaging experiments, the system will be fully relaxed and the images will contain no contribution from either $T_1$ or $T_2$ and so will be dependent on proton density $\rho$, possibly with some $T_2^*$ weighting arising during the acquisition, where $T_2^*$ is the relaxation time due to inhomogeneities in the magnetic field. However, if the repetition time $T_R$ is much shorter than both $T_1$ and $T_2$, then fluctuations in intensity have been found to occur in subsequent images before equilibrium is reached. The amplitude and duration of these fluctuations has been found to depend on $T_1$, $T_2$, and the rf flip angle $\theta$, and the frequency of these fluctuations depends solely on $\theta$ with the rate of increase of frequency being proportional to flip angle. In the preferred embodiment, this transient behaviour of one and the same resonance response signal is analysed to obtain values of $T_1$ and $T_2$. The value of the flip angle $\theta$ may also be obtained.

The numerical solution of the Bloch equation may be used to obtain the values of these parameters. The Bloch equation governs the evolution of the magnetism M of the system according to $$\frac{dM}{dt} = \gamma M \times B_{tot} \qquad (1)$$

where $B_{tot}$ is the total field at a point and comprises a sum of static field $B_0$, applied rf, sample effects and applied gradients, and where $\gamma$ is the gyromagnetic ratio. To incorporate the effects of relaxation, terms are added for $T_1$ (spin-lattice relaxation) and $T_2$ (spin-spin relaxation) effects, to give $$\frac{dM}{dt} = \gamma M \times B_{tot} + \frac{(M_0 - M_z)}{T_1} k - \frac{(M_x i + M_y j)}{T_2} \qquad (2)$$

where i,j and k are unit vectors in the x,y and z directions respectively. This equation may be solved by integrating over a sum of spins for a saturation recovery sequence to give a simulated sequence.

In a saturation recovery sequence, if the repetition time $T_R$ between pulses with flip-angle $\theta$ is very much greater than $T_1$, complete relaxation of the magnetisation occurs, and the intensity of the images remains the same.

If $T_R \gg T_2$ but $T_R \leq T_1$, then a pseudo steady state is reached, in which the equilibrium z-component of the magnetisation, $M_\infty$, is given by $$M_\infty = M_0 \frac{\left(1 - \exp\left(\frac{-T_R}{T_1}\right)\right)}{\left(1 - \cos\theta \exp\left(\frac{-T_R}{T_1}\right)\right)} \qquad (3)$$

where $M_0$ is the initial magnetisation. In a known technique for measuring $T_1$, this pseudo steady state is used to calculate $T_1$ from the ratio of the equilibrium level to the initial level by using Equation (3). However, this technique cannot be used to calculate $T_2$.

If $T_R \leq T_2$ as well as $T_R \leq T_1$, then the image intensity will fluctuate before equilibrium is reached. The first image collected is therefore the proton density image (plus $\theta$ and $T_2^*$ weighting) followed, in subsequent images, by an oscillation whose amplitude, frequency and steady state value depend upon $T_1$, $T_2$ and $\theta$. These fluctuations are always present when EPI experiments are repeated with a short repetition time, but in conventional experiments the information is discarded either by discarding the first few images and viewing the equilibrium, or by using RF or gradient spoiling to suppress the $T_2$ effects. However, it has been recognised pursuant to the present invention that, instead of simply discarding these data, they can be used to calculate both of the parameters, $T_1$ and $T_2$. For example, a nonlinear method may be used to fit the theoretical model to the transient data. In order to use the transient response in this way, each gradient evolution is advantageously identical so that the stimulated echoes are preserved.

Figure 2:
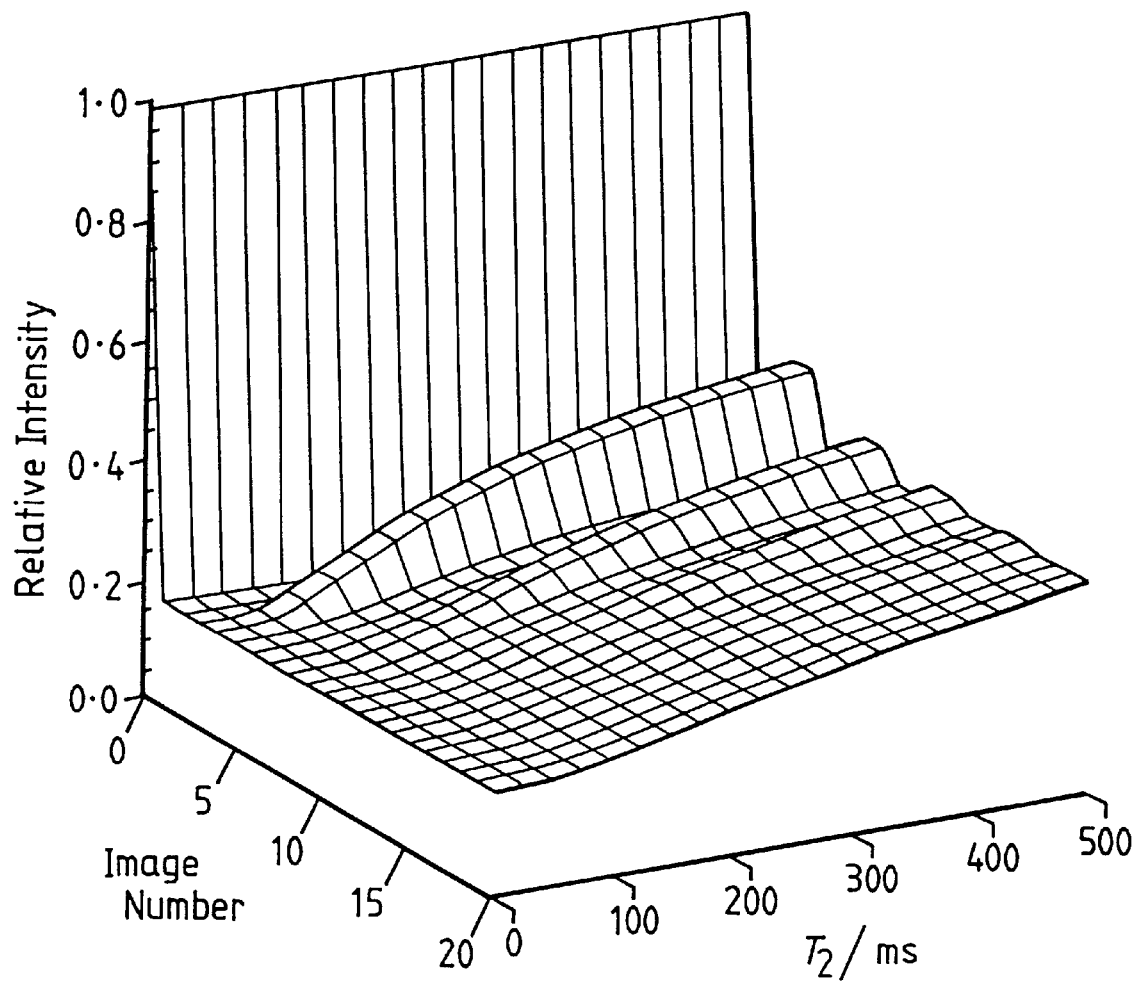
FIG. 2 shows the evolution of signal intensity at different values of $T_2$ when $T_1$=500 ms, $\theta$=90°, and $T_R$=100 ms.

FIG. 2 shows how $T_2$ affects the evolution of the image intensity when $\theta$=90°. When $T_2$ is small, there is no change in intensity after the second image. As $T_2$ increases, fluctuations start to appear before a different equilibrium is reached. An analytical calculation of the first few points reveals a series of terms containing $T_1$, and, from point 4 onwards, $T_2$. For example, the z-component of the magnetisation at the fourth point is given by $$M_{z4} = M_{z0}\left[1 - \exp\left(-\frac{T_R}{T_1}\right) + \frac{1}{2}\exp\left(\frac{-T_R}{T_1}\right)\exp\left(\frac{-2T_R}{T_2}\right)\right] \quad (4)$$

The analytical calculation of the points rapidly becomes cumbersome as the number of points increases, and so a numerical simulation which describes the evolution of intensity when provided with $T_1$, $T_2$, $T_R$ and $\theta$ may be used instead to calculate $T_1$, $T_2$, and $\theta$ by performing a least squares fit.

A suitable numerical simulation has been found to be the Levenberg-Marquardt algorithm, as described by Marquardt in J. Soc. Indust. Appl. Math. vol. 11, pp 431–441 (1963). In this case, the Leyenberg-Marquardt algorithm usually uses the first order partial derivatives to minimise the parameter $$\chi^2 = \sum_{i=1}^{N} \left(\frac{y_i - y(x_i; T_1, T_2, T_R, \theta, \rho)}{\sigma_i}\right)^2 \quad (5)$$

where N is the number of points and $\sigma_i$ is the standard deviation in the point $(x_i, y_i)$. In the present technique, the uncertainty in each point is the same, so it is valid to use uniform weighting by setting $\sigma_1 \ldots \sigma_N = 1$. Since the Levenberg-Marquardt algorithm is numerical, most of the partial derivatives are not available, and so here forward differences are used instead. For instance, it is assumed that the partial differential of the parameter $T_1$ is given approximately by $$\frac{\partial f}{\partial T_l} \approx \frac{f(T_l + \delta T_l) - f(T_l)}{\delta T_l} \quad (6)$$

and similarly for the other parameters. The exact partial derivative is known for $\sigma$ so this may be used instead of the approximation.

Initial estimates of the parameters $T_1$, $T_2$, and $\theta$ and the estimates of the partial derivatives are then fed into the numerical simulation, along with the values of $T_R$ and $\sigma$, and the values of $T_1$, $T_1$, and $\theta$ are then calculated by performing a least squares fit.

As a fitting technique, the above numerical simulation has the advantage of giving exact quantitative values directly with no need for further calibration of the experiments. However, the fit is quite slow.

An alternative fitting technique involves describing the transient behaviour empirically.

For example, an empirical equation could be used together with a mapping of the fit parameters onto the $T_1$, $T_2$ and $\theta$ values. An example of such an equation is Y(i)=A+Bexp(-Ci)+Dsin(iE+F)exp(-Gi) (7)

where i is the image number and A to G are parameters. The values of $T_1$, $T_2$ and $\theta$ are mainly dependent on the values A and D, with the value of $\theta$ being mainly dependent on E.

This technique relies on being able to calibrate the apparatus before performing the experiment. For instance, a calibration scan may be performed on a sample with known values of $T_1$ and $T_2$ and the results of this scan used to determine a mapping of the fit parameters to values of $T_1$ and $T_2$. This mapping may then be used in subsequent scans to map the fit parameters onto $T_1$, $T_2$ and $\theta$, where $T_1$, $T_2$ and $\theta$ are unknown. This fitting technique has the advantage of being faster than the numerical method described above.

The measurements of $T_1$ and $T_2$ are better performed at a repetition time that gives a high rate of change in $X^2$. An optimum repetition time exists which gives the largest rate of change in $X^2$, with less reliable results at both longer and shorter repetition times. The optimum repetition times for the measurement of $T_1$ and $T_2$ differ.

In the absence of $T_2$ effects, the repetition time that gives the best sensitivity to changes in $T_1$ is easily shown by differentiation of the first two terms of Equation (4) to be $T_R = T_1$. No analytic solution exists for the optimum repetition time for the measurement of $T_2$, but the optimum can be calculated numerically, using an interpolation method such as inverse parabolic interpolation, and depends on $T_1$, $T_2$, $\theta$, and the number of points acquired. $T_1$ sensitivity is generally better than $T_2$ sensitivity, so it is usually better to optimise for $T_2$. $T_2$ sensitivity can be defined as the larger change in $X^2$ when $T_2$ is increased and decreased by 1%. A suitable inverse parabolic interpolation is described by Brent in "Algorithms for Minimisation without Derivatives", Chapter 5, Prentice-Hall Inc., Englewood Cliffs, N.J., 1973.

A technique for obtaining values of $T_1$, $T_2$ and $\theta$ therefore includes first determining the optimum repetition time, and applying a pulse sequence with this (constant) repetition time. Using the optimum repetition time will help to ensure that noise does not destroy the precision of the measurements.

The optimum number of pulses is a trade off between accuracy and the acquisition and fitting time. In principle a minimum of five points is necessary to perform the fit. This makes the minimum data acquisition time equal to five times the repetition time of the experiment. Acquiring more points improves the results, but slows down the acquisition and fitting of the data. In general, the optimum number of pulses will be that which gives as much transient data as possible, before the steady state is reached. This number may be estimated before performing the experiment, and a pulse sequence with this number of pulses then applied.

Figure 3:
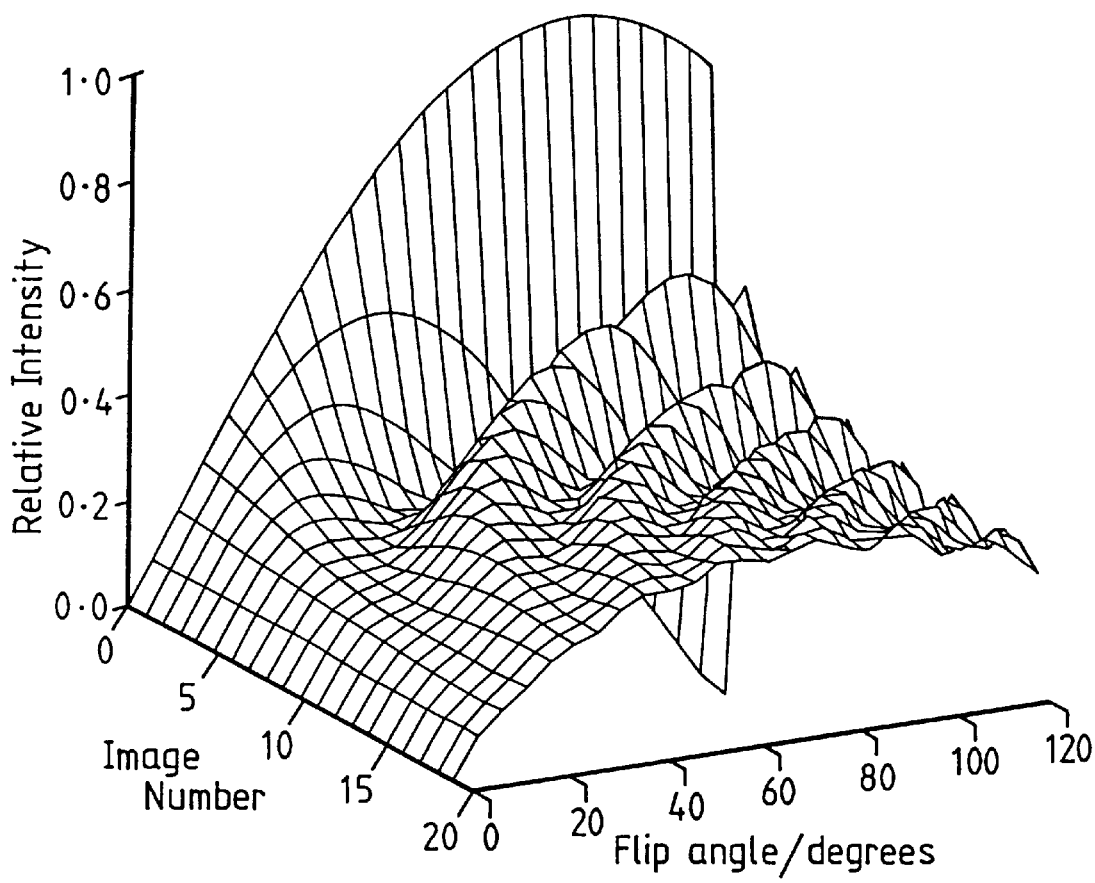
FIG. 3 shows the evolution of intensity at different flip angles, with relaxation not included ($T_R$=0)

When using the above fitting techniques, the flip-angle $\theta$ is calculated along with $T_1$ and $T_2$. The flip angle is dependent on the experimental set-up, and affects not only the size of the fluctuations, but also their frequency, and it is therefore important that it be taken into account when calculating $T_1$ and $T_2$. The effect of the flip-angle on the evolution of the image intensity is shown in FIG. 3. It is pointed out that when $\theta = 90°$, pairs of points (2 and 3, 4 and 5, and so on) have the same intensity.

Although the above fitting procedures fit to $\theta$ as well as to $T_1$ and $T_2$, the fitting can be made more efficient by calculating a value of $\theta$ prior to the fitting, and using this value as the first estimate of $\theta$. Since the frequency of the fluctuations is dependent on $\theta$, a simple Fourier transform could be calibrated and used to derive an estimate of $\theta$, for subsequent use by the fitting procedure as the first estimate.

The fitting techniques described above derive very good estimates of $\theta$, and these might be useful, for example in setting up other experiments, and in the investigation of the $B_1$ homogeneity and the slice uniformity of a probe. Although the value of $\theta$ is theoretically constant across the image, in practice there may be some variation. It is therefore possible to derive a $\theta$ map using the fitting procedures described. This may be useful, for example in calibration, for assessing the quality of $T_1$, $T_2$ or $\rho$ maps, and for weighting in subsequent imaging experiments. For example, the $\theta$ map may be derived, then this map smoothed using a smoothing procedure, and the values of $\theta$ that are thereby obtained may be used in a subsequent fitting procedure to get high precision quantitative maps of $T_1$ and/or $T_2$.

If the EPI sequence of FIG. 1 is used, a set of images will be obtained, corresponding to the number of rf pulses. The fit referred to above may be made on a pixel-by-pixel basis through the set of images. Alternatively, the averages of groups of pixels (region of interest) may be determined, and the fits made to the average values. The pixel-by-pixel approach is generally preferred where the magnetic field strength is high, resulting in a high signal-to-noise ratio, since it makes maximum use of the data. In cases where the signal-to-noise ratio is low, the region of interest approach will increase the signal-to-noise ratio and improve the fit. The region of interest approach also has the advantage of being much faster, since fewer fits need to be made.

The magnitude of each point may be obtained by taking the modulus of the real and imaginary channels. This approach is satisfactory while the points are positive. However, should negative points occur, taking the modulus will result in the negative points being converted into positive points, leading to errors.

Negative points will occur if the magnitude of the rf pulse rises above a certain threshold value. If this should happen, the magnetisation will not recover to the x-y plane before the second rf pulse, and in this case the model predicts negative points. It can be shown that the value of this threshold flip angle, $\theta_t$, is $$\theta_t = \cos^{-1}\left[1 - \exp\left(\frac{T_R}{T_1}\right)\right] \quad (8)$$

It is possible to use the phase of the data to spot the negative points. If the real and imaginary parts of the data are used to calculate the phase angle for each point, then the negative points are easily spotted as the phase angle changes sign. Therefore, the points where the phase angle of the real and imaginary parts of the data changed sign in the phase map of the first image are treated as being negative values, and the rest of the points are left positive as in a conventional modulus image.

Usually it will be possible to avoid negative values altogether, and the accompanying problems in modulus images, by ensuring that $\theta < \theta_t$. For example $\theta < 90°$ will never allow negative values, and if it possible to set this condition at every pixel then this is preferable. This precaution is not possible with, for example, inversion recovery, where some negative points are inevitable. An alternative way of preventing negative points would be to set $T_R > T_1 \ln 2$ so that Equation (8) has no solution.

The preferred embodiment of the invention was implemented using the language IDL (Interactive Data Language) for the Bloch equation simulator and the Levenberg-Marquardt algorithm.

Firstly, a simulation was performed in which noise was added to theoretical data to create data sets with a range of known signal-to-noise ratios. Fits were done in order to assess the effect of noise on the precision of the fits. For example, the precision in the parameter $T_1$, $P(T_1)$, was defined as being $$P(T_1) = \frac{T_1}{\sigma_{T_1}} \quad (9)$$

where $\sigma_{T_1}$ is the standard deviation in $T_1$.

Figure 4:
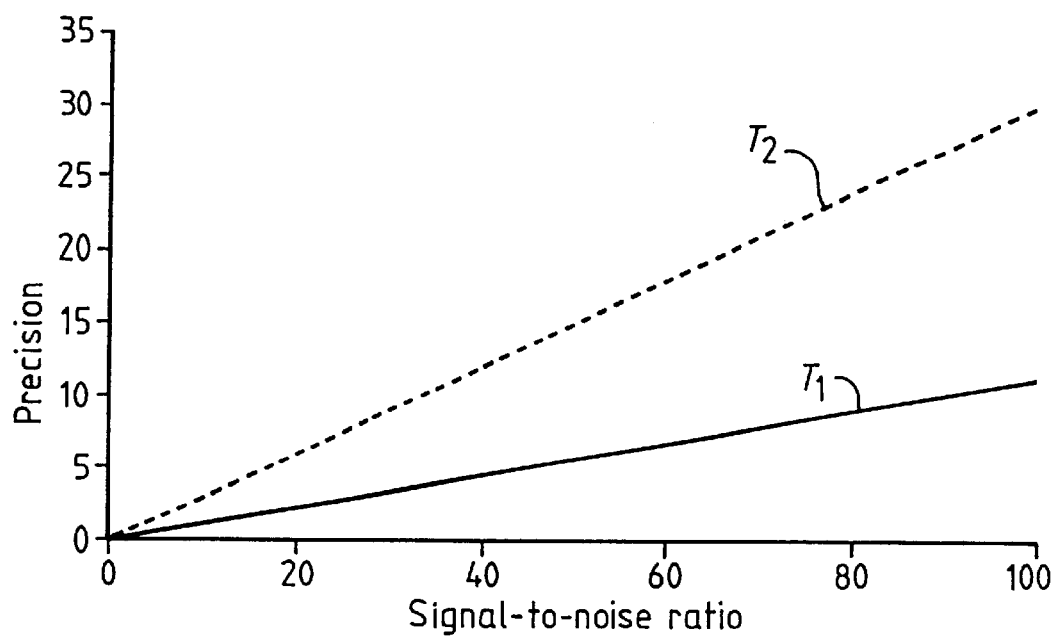
FIG. 4 shows the precision of $T_1$ (solid line) and $T_2$ (dashed line) with $T_1$=600 ms, $T_2$=200 ms, $\theta$=900, and $T_R$=100 ms.

The case simulated was $T_1=600$ ms, $T_2 200$ ms, $\theta=90°$, and $T_R 100$ ms. The result of this experiment is shown in FIG. 4, in which the solid line shows the precision of $T_1$ and the dashed line shows the precision of $T_2$. The precision of the parameters is shown to be proportional to the signal-to-noise ratio. It can be seen that in this case the $T_2$ precision, at 0.30 times the signal-to-noise, is better than the $T_1$ precision, which is 0.11 times the signal-to-noise ratio. This is because the $T_R$ chosen favours $T_2$ measurement. If the repetition time were increased so that it were closer to $T_1$, then the $T_1$ precision would improve somewhat, but the $T_2$ precision would fall away dramatically. The precision of the flip angle and proton density are relatively high in comparison at 2.2 and 0.49 times the signal to noise respectively.

Experiments were then performed on some phantoms of aqueous manganese chloride and copper sulphate at various concentrations. These provided a small variety of values for the relaxation times, which were also measured by other methods to provide comparisons. $T_1$ was measured with a conventional saturation recovery sequence and $T_2$ was measured using a CPMG (Carr-Purcell-Meiboon-Gill) sequence on a MARAN 20MHz spectrometer manufactured by Resonance Instruments of Oxford, UK.

The experiments were performed on a 0.5T whole body system manufactured by SMIS Ltd of Guildford, UK. In order to provide the necessary gradient strength for the EPI experiments, a 30 cm diameter gradient set was used, which gives maximum gradient strengths of 42 mTm$^{-1}$ along the z-axis and 25 mTm$^{-1}$ along the x- and y-axes. A small-bore 20 cm rf saddle probe was used in order to give adequate signal-to-noise.

The technique was tested with $\theta \approx 90°$ on the MnCl$_2$ and CuSO$_4$ phantoms. The reference measurements were used to determine a repetition time that gave good $T_2$ contrast for each phantom. In this experiment, the repetition time was set to 100 ms.

Figure 5:
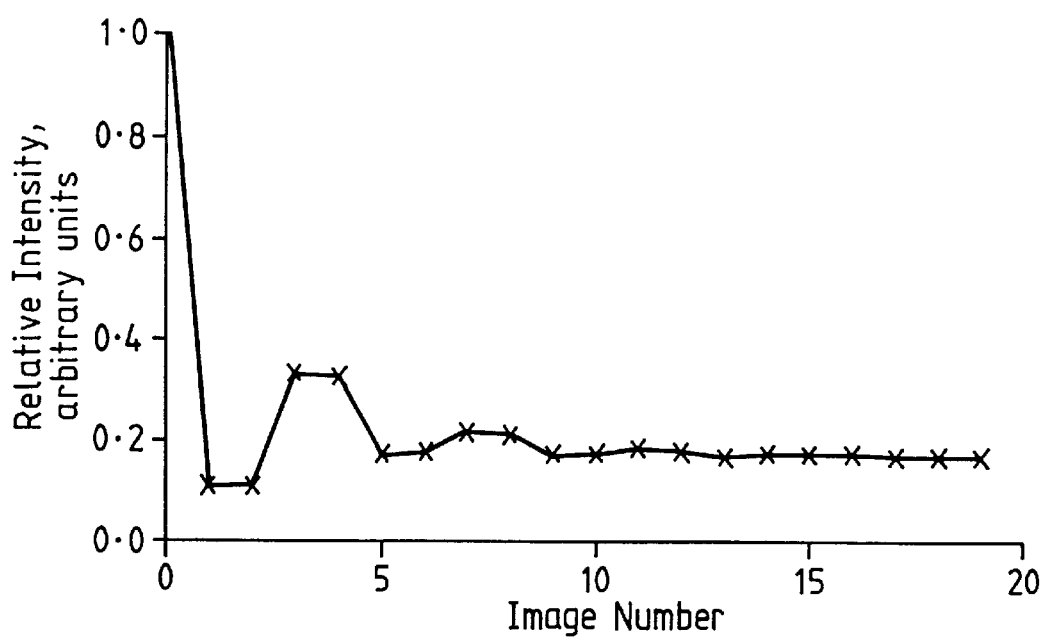
FIG. 5 shows the saturation recovery data acquired from a ~0.3 mM $MnCl_2$ phantom with $T_R$=50 ms.

In a first experiment, results were obtained over the whole phantom, without gradients, on a non-imaging basis, in order to test the basis of the technique with maximum signal. Data were acquired immediately after a series of rectangular $\theta_x$ pulses separated by time $T_R$. These gave the expected intensity evolution, and the Bloch equation was fitted to the data using the above technique in order to find the parameters $T_1$, $T_2$, and $\theta$. FIG. 5 shows an example of one of these fits.

A comparison of the measured values of $T_1$ and $T_2$ with the reference values for the non-imaging experiment is shown in FIGS. 6a and 6b. The diamonds show the result for conventional saturation recovery, whilst the triangles show the results for the present technique. For FIG. 6a the solid shows the fit y=0.986x −12.5 through the diamonds, and the dashed line shows the fit y=0.918x+3.10 through the triangles. For FIG. 6b, the fits are y=1.068x−7.59 for $T_1$ and y=0.929x−3.06 for $T_2$. It can be seen that the agreement is good, with a mean error of ±3% for $T_1$ and ±7% for $T_2$, and therefore no further calibration is necessary.

In a second experiment, the technique was applied to sequences of EPI images. Image data sets were acquired on the 0.5T system using the MBEST sequence shown in FIG. 1. Quarter k-space acquisitions were used in order to reduce the effect of $T_2$*. The pixel size was 8 nmm×2 mm in a field of view of 128 mm×128 mm. Sequences of echo planar images of the phantom were acquired with $T_R=100$ ms and a slice thickness of 10 mm. Twenty images were used in this experiment, which gave a good compromise between accuracy and acquisition and fitting time. The first eight of these images are shown in FIG. 7 (see images A to H). It can be seen that the image intensity fluctuates through the set of images. $T_1$ was typically 1530 ms and $T_2$ 770 ms.

Fits using the averages of groups of pixels (region of interest), as well as pixel-by-pixel fits were performed in order to compare the accuracy of the two methods to each other and to reference results using bulk saturation recovery and bench-top results. In this instance the pixel-by-pixel fits were unsuccessful because the signal-to-noise proved too great with regions this small. However, increasing the field strength or other methods of raising the signal-to-noise should make pixel-by-pixel fits quite feasible.

The results of the region of interest fits are the results shown by the triangles in FIG. 6. It can be seen that the results are still correct, but the random error is increased somewhat by the extra noise, in agreement with the theoretical predictions.

In this case, the mean error was ±11% in $T_1$ and ±9% in $T_2$.

It has been assumed that the decay processes are single exponentials. In practice, they may be multi-exponentials. The fitting procedure of the preferred embodiment may therefore be modified to take this into account.

FIG. 8 shows a flow diagram illustrating the method of a preferred embodiment of the invention.

In step S100, the number of points N and the repetition time $T_R$ are selected. In step S101, a single excitation pulse is applied. In step S102, a single or multiple scan technique, such as an PPI technique, is used to acquire image data by sampling the echo data resulting from the pulse. If, in step S103, the number of pulses is less than N, the method proceeds to step S104, in which the time since the last pulse is determined. If this time is less than $T_R$, the time since the last pulse is repeatedly determined until the time since the last pulse is equal to or greater than $T_R$. Steps S101 through to S103 are then repeated until the number of pulses is equal to N. The method then proceeds to step S105, in which the echo data resulting from the excitation pulses is processed to produce N images. In step S106, the Bloch equation is fitted on either the first pixel or the region of interest through the set of N images. In step S107, it is determined whether the Bloch equation has been fitted to all of the pixels or to all of the regions of interest through the set of images. If not, step S106 is repeated until the fit has been made on either all of the pixels or all of the regions of interest. The method then proceeds to step S108 in which the thus determined $T_1$ and/or $T_2$ maps are displayed.

FIG. 9 shows a preferred embodiment of the apparatus. A sample 10 is placed in a constant magnetic field supplied by magnet 12. An rf transmitter/receiver probe 14 is used to apply excitation pulses to the sample 10 and to detect a resonance response signal. The probe 14 is driven by a pulse programmer 16 via a modulator 18, a mixer 20 and a linear power amplifier 22. The resonance response signal is fed to an acquisition computer 24 via a preamplifier 26, a rf amplifier 28, a mixer 30 and phase sensitive detectors 32,34. An oscillator 36 having a reference frequency synchronises the excitation pulses and the detected signal by means of the mixer 20 and the mixer 30 respectively. Gradient coils 38 provide the gradients necessary for acquiring the resonance response signal. The gradient coils are driven by the pulse programmer 16 via gradient coil amplifiers 40,42,44 using data stored in the waveform memory 46.

The acquisition computer 24 processes the acquired resonance response signal to determine values of $T_1$, $T_2$, θ, and ρ. Images may be produced based on any of these parameters or combinations thereof.

The techniques described by way of example herein are capable of measuring $T_1$, $T_2$, θ, and ρ simultaneously. They may be used with non-imaging techniques, or with imaging techniques such as EPI and 2DFT$_1$ A complete mapping of proton density, $T_1$ and $T_2$ plus θ may be made in a period of order of 2×$T_1$ seconds (and typically between $T_1$ and 3×$T_1$ seconds). Use is made of the transient approach to steady state to evaluate these parameters. $T_1$ and $T_2$ maps may be produced from a repeated sequence of single-plane images, with an acquisition time of the order of a few seconds for relaxation times in the range 50–1000 ms. The techniques avoid the systematic errors associated with imprecise flip-angles, for example θ<180° in an inversion recovery experiment, which can arise due to rf inhomogeneity or imprecise calibration. The techniques work both with a bulk saturation recovery sequence and a spatially resolved EPI sequence, as long as the condition $T_R<<T_1$, $T_2$ is fulfilled; the techniques operate particularly well when $T_1$ and/or $T_2$ are less than 1000 ms. The entire data acquisition takes no more than a few seconds for $T_R$=100 ms. The techniques provide more precise measurements of $T_1$ than single repetition time acquisitions.

A class of pulse sequences has been presented which allows two separate parameters to be measured simultaneously. The sequence is inherently fast, being able to acquire all data in around 2 seconds. Any image weighting may then be calculated from the raw data for display purposes.

Alternative pulse sequences could also be used. For example, a sequence consisting of 90° and 180° pulses could be used, in this case the 180° pulses serving to refocus $T_2^*$, to give less distortion. A whole range of values of $T_R$ could be used.

These techniques should prove useful whenever $T_1$ and $T_1$ maps are needed in a short time. Living tissue generally has suitable values of $T_1$ and $T_1$ for these techniques. They could also be useful in subjects such as rf homogeneity mapping, bolus tracking, and tissue characterisation methods. They could also find a use in determining imaging parameters for slower but more accurate imaging methods.

It will be understood that the present invention has been described above purely by way of example, and modifications of detail can be made within the scope of the invention.

Each feature disclosed in the description, and (where appropriate) the claims and drawings may be provided independently or in any appropriate combination.

What is claimed is:

1. Apparatus for determining values of relaxation parameters, $T_1$ and $T_2$, for use with a magnetic resonance technique in which a resonance response signal is produced in response to excitation of a sample, the apparatus comprising:

means for applying a plurality of excitation pulses to the sample, means for detecting a plurality of resonance signals, each response signal representative of individual images, during an approach to steady state where the intensity evolution of respective response signals exhibits transient behaviour, means determining values of both, $T_1$ and $T_2$ by fitting data derived from said response signals to a model that describes the transient evolution of the image intensity in terms of $T_1$ and $T_2$.

2. Apparatus according to claim 1 wherein the means for determining the values of $T_1$ and $T_2$ is arranged to determine their values from the transient behaviour of the response signal.

3. Apparatus according to claim 2 wherein the means for determining the values of $T_1$ and $T_2$ is arranged to determine their values by fitting an equation to the transient behaviour of the response signal.

4. Apparatus according to claim 3 wherein the means for determining the values of $T_1$ and $T_2$ comprises means for fitting the Bloch equation to the transient behaviour of the response signal.

5. Apparatus according to claim 3 wherein the means for determining the values of $T_1$ and $T_2$ comprises means for fitting an equation to the transient behaviour of the response signal to thereby obtain a set of fit parameters, and means for mapping the set of fit parameters to the values of $T_1$ and $T_2$ using predetermined calibration values.

6. Apparatus according to claim 1, wherein the means for determining the values of $T_1$ and $T_1$ is adapted to determine values of the flip angle, $\theta$.

7. Apparatus according to claim 1, for resonance testing the sample, comprising:
means for applying the excitation;
means for detecting the response signal; and
the means for determining the values of $T_1$ and $T_2$.

8. Apparatus according to claim 7 wherein the means for detecting the response signal comprises means for acquiring a set of image data.

9. Apparatus according to claim 8 wherein the means for acquiring image data is adapted to acquire such data using a single or multiple scan technique, such as Echo Planar Imaging, Echo Volumar Imaging, a Spiral Scan method or a 2-Dimensional Fourer Transformation technique.

10. Apparatus according to claim 8 wherein the means for determining the values of $T_1$ and $T_2$ is arranged to perform a pixel-by-pixel fitting procedure through the set of image data.

11. Apparatus according to claim 8 wherein the means for determining the values of $T_1$ and $T_2$ comprises means for determining average values of groups of pixels and means for performing a fitting procedure to the average values through the set of image data.

12. Apparatus according to claim 7 wherein the means for applying the excitation comprises means for applying a sequence of excitation pulses.

13. Apparatus according to claim 12 further comprising means for applying a gradient magnetic field after at least two of said pulses, the field being the same for each of at least two of said pulses.

14. Apparatus according to claim 12 further comprising means for determining an appropriate number of repetitions of the excitation pulses for the determination of $T_2$ and $T_1$, and wherein the excitation applying means is adapted to apply said appropriate number of excitation pulses.

15. Apparatus according to claim 12 further comprising means for determining an appropriate time interval between the excitation pulses for the determination of $T_2$ and $T_1$, and wherein the means for applying excitation is adapted to apply pulses with said appropriate time interval.

16. Apparatus according to any of claim 8 wherein the means for applying excitation is arranged to apply between 5 and 40, and preferably between 10 and 25, excitation pulses.

17. Apparatus according to claim 8 wherein the means for applying excitation is arranged to apply pulses with a repetition time of between 1 ms and 500 ms, and preferably between 10 and 300 ms, and more preferably between 50 ms and 150 ms.

18. Apparatus according to claim 1 further comprising means for generating an image in dependence upon the values of $T_1$ and/or $T_2$.

19. Apparatus according to claim 1 further comprising means for generating an image in dependence upon the value of $\theta$.

20. Apparatus according to claim 1 further comprising means for determining, from the values of $T_1$ and/or $T_2$, a weighting for a further parameter.

21. A method of determining values of relaxation parameters, $T_1$ and $T_2$, for use with a magnetic resonance technique in which a resonance response signal is produced in response to excitation of a sample, the method comprising:
applying a plurality of excitation pulses to the sample,
detecting a plurality of response signals, each representative of individual images, during an approach to steady state where the intensity evolution of respective response signals exhibits transient behaviour,
determining values of both $T_1$ and $T_2$ by fitting data derived from said response signals to a model that describes the transient evolution of the image intensity in terms of $T_1$ and $T_2$.

22. A method according to claim 21 wherein the step of determining the values of $T_1$ and $T_2$ comprises determining their values from the transient behaviour of the response signal.

23. A method according to claim 22 wherein the step of determining the values of $T_1$ and $T_2$ comprises determining their values by fitting an equation to the transient behaviour of the response signal.

24. A method according to claim 23 wherein the step of determining the values of $T_1$ and $T_2$ comprises fitting the Bloch equation to the transient behaviour of the response signal.

25. A method according to claim 23 wherein the step of determining the values of $T_1$ and $T_2$ comprises fitting an equation to the transient behaviour of the response signal to thereby obtain a set of fit parameters, and mapping the set of fit parameters to the values of $T_1$ and $T_2$ using predetermined calibration values.

26. A method according to claim 21 further comprising determining values of the flip angle, $\theta$.

27. A method according to claim 21, for resonance testing the sample, comprising the steps of:
applying the excitation;
detecting the response signal; and
determining the values of $T_1$ and $T_2$.

28. A method according to claim 27 wherein the step of detecting the response signal comprises acquiring a set of image data.

29. A method according to claim 28 wherein the step of acquiring image data comprises acquiring such data using a single or multiple scan technique, such as Echo Planar Imaging, Echo Volumar Imaging, a Spiral Scan method or a 2-Dimensional Fourier Transformation technique.

30. A method according to claim 28 wherein the step of determining the values of $T_1$ and $T_2$ comprises performing a pixel-by-pixel fitting procedure through the set of image data.

31. A method according to claim 28 wherein the step of determining the values of $T_1$ and $T_2$ comprises determining average values of groups of pixels, and performing a fitting procedure to the average values through the set of image data.

32. A method according to claim 27 wherein the step of applying excitation comprises applying a sequence of excitation pulses.

33. A method according to claim 32 further comprising applying a gradient magnetic field after at least two of said pulses, the field being the same for each of at least two of said pulses.

34. A method according to claim 32 further comprising determining an appropriate number of repetitions of the excitation pulses for the determination of $T_2$ and $T_1$, and wherein the step of applying excitation comprises applying said appropriate number of excitation pulses.

35. A method according to claim 32 further comprising determining an appropriate time interval between the excitation pulses for the determination of $T_2$ and $T_1$, and wherein the step of applying excitation comprises applying pulses with said appropriate time interval.

36. A method according to claim 32 wherein the step of applying excitation pulses comprises applying excitation pulses with a repetition time of less than $T_1$ and preferably less than half, and more preferably less than one quarter, $T_1$.

37. A method according to claim 32 wherein the step of applying excitation pulses comprises applying excitation pulses with a repetition time of less than $T_2$ and preferably less than half, and more preferably less than one quarter, $T_2$.

38. A method according to claim 27 wherein the step of applying excitation comprises applying between 5 and 40, and preferably between 10 and 25, excitation pulses.

39. A method according to claim 27 wherein the step of applying excitation comprises applying pulses with a repetition time of between 1 ms and 500 ms, and preferably between 10 and 300 ms, and more preferably between 50 ms and 150 ms.

40. A method according to claim 21 further comprising generating an Image in dependence upon the values of $T_1$ and/or $T_2$.

41. A method to claim 21 further comprising generating an image in dependence upon the value of $\theta$.

42. A method to claim 21 further comprising determining, from the values of $T_1$ and/or $T_2$ and/or $\theta$ a weighting required for a further parameter.

43. A method according to claim 21 further comprising generating a $\theta$ map, smoothing the $\theta$ map, and using the smoothed $\theta$ map for determining values of $T_1$ and $T_2$.

* * * * *